United States Patent
Yang et al.

(10) Patent No.: US 9,387,946 B2
(45) Date of Patent: Jul. 12, 2016

(54) PANEL UNPACKING METHOD AND PANEL UNPACKING DEVICE

(71) Applicant: Shenzhen China Star Optoelectronics Technology Co., Ltd., Shenzhen, Guangdong (CN)

(72) Inventors: Guokun Yang, Shenzhen (CN); Chunhao Wu, Shenzhen (CN); Kunhsien Lin, Shenzhen (CN); Minghu Qi, Shenzhen (CN); Zhenhua Guo, Shenzhen (CN); Yongqiang Wang, Shenzhen (CN); Zenghong Chen, Shenzhen (CN); Chenyangzi Li, Shenzhen (CN); Zhiyou Shu, Shenzhen (CN); Weibing Yang, Shenzhen (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 862 days.

(21) Appl. No.: 13/806,818

(22) PCT Filed: Dec. 1, 2012

(86) PCT No.: PCT/CN2012/085705
§ 371 (c)(1),
(2) Date: Dec. 24, 2012

(87) PCT Pub. No.: WO2014/079098
PCT Pub. Date: May 30, 2014

(65) Prior Publication Data
US 2014/0144107 A1  May 29, 2014

(30) Foreign Application Priority Data
Nov. 23, 2012 (CN) .......................... 2012 1 0484285

(51) Int. Cl.
*B65B 23/20* (2006.01)
*B65B 69/00* (2006.01)
(Continued)

(52) U.S. Cl.
CPC ................. *B65B 23/20* (2013.01); *B65B 69/00* (2013.01); *B65G 49/061* (2013.01);
(Continued)

(58) Field of Classification Search
CPC ................... B65B 23/20; B65B 69/00; B65G 49/05–49/069; B65G 2249/04; H01L 21/6835; H01L 21/6838
USPC ...................................................... 53/245, 536
See application file for complete search history.

(56) References Cited

U.S. PATENT DOCUMENTS 3,790,003 A * 2/1974 Tausheck ............. B65G 49/067
414/494

(Continued)

FOREIGN PATENT DOCUMENTS

CN          2041304 U       7/1989
CN          2190642 Y       3/1995
(Continued)

*Primary Examiner* — Stephen F Gerrity
(74) *Attorney, Agent, or Firm* — Andrew C. Cheng

(57) ABSTRACT

A panel unpacking method includes (1) providing a panel unpacking device, which includes a pickup device including a manipulator and suction cups mounted to the manipulator and a conveyance device including a main body, a mounting board mounted to the main body, pins mounted to the mounting board, and cushioning device installed on the pins; (2) moving the manipulator to approach the panel until the suction cups of the manipulator get into contact with the panel; (3) the suction cups sucking and holding the panel and the manipulator making a movement to lift up the panel; (4) the manipulator carrying the panel to approach the pins of the conveyance device until the panel gets into contact with the contact sections of the pins; and (5) the suction cups releasing the panel to allow the panel to be stably positioned on the pins of the conveyance device.

9 Claims, 6 Drawing Sheets

(51) Int. Cl.
  *B65G 49/06* (2006.01)
  *H01L 21/683* (2006.01)
  *H01L 21/677* (2006.01)

(52) U.S. Cl.
  CPC .......... *B65G 49/064* (2013.01); *B65G 49/068* (2013.01); *H01L 21/677* (2013.01); *H01L 21/6838* (2013.01); *B65G 2249/04* (2013.01)

(56) References Cited

U.S. PATENT DOCUMENTS

| | | | | |
|---|---|---|---|---|
| 3,910,425 A | * | 10/1975 | Mahara et al. | B65G 49/068 271/314 |
| 3,973,673 A | * | 8/1976 | Ahluwalia | B65G 47/252 198/374 |
| 4,413,820 A | * | 11/1983 | Meeker et al. | B65G 49/069 271/11 |
| 8,593,613 B2 | * | 11/2013 | Chen | G03F 7/70733 156/580 |
| 2007/0098539 A1 | * | 5/2007 | Chang et al. | B65G 47/29 414/788.1 |
| 2007/0292632 A1 | * | 12/2007 | Yoshida | B65G 49/061 428/1.1 |
| 2011/0141448 A1 | * | 6/2011 | Aoki et al. | B65G 49/064 355/72 |
| 2012/0313308 A1 | * | 12/2012 | Yan et al. | B25B 11/005 269/21 |

FOREIGN PATENT DOCUMENTS

| | | | | |
|---|---|---|---|---|
| CN | 2568650 Y | | 8/2003 | |
| CN | 1574272 A | | 2/2005 | |
| CN | 101013217 A | | 8/2007 | |
| CN | 101013217 A | | 8/2007 | |
| CN | 101704454 A | | 5/2010 | |
| CN | 102495492 A | | 6/2012 | |
| EP | 1388511 A2 | | 2/2004 | |
| JP | 54012990 A | * | 1/1979 | ................ B65B 5/00 |
| JP | 62214072 A | * | 9/1987 | ............. B62D 65/00 |
| WO | WO 2008029943 A1 | * | 3/2008 | ........... B65G 49/061 |

* cited by examiner

1 — providing a panel unpacking device, wherein the panel unpacking device comprises a pickup device and a conveyance device, the pickup device comprising a manipulator and suction cups mounted to ends of the manipulator, the conveyance device comprising a main body, a mounting board mounted on the main body, pins mounted on the mounting board, and cushioning devices installed on the pins, the pins each comprising a pin stem and a contact section connected to an end of the pin stem, the cushioning devices each having an end positioned against the contact section of the respective pin and an opposite end positioned against the mounting board, the mounting board forming a plurality of positioning holes corresponding to the pins, ends of the pin stems of the pins that are distant from the contact sections being respectively received in the positioning holes and movable in the positioning holes in an axial direction of the positioning holes 2 — moving the manipulator to a location exactly above a panel to be unpacked and moving the manipulator downward to approach the panel until the suction cups at the ends of the manipulator get into contact with the panel 3 — the suction cups sucking and holding the panel and the manipulator making a movement to lift up the panel 4 — the manipulator carrying and moving the panel to a location exactly above the conveyance device, the manipulator moving downward to approach the pins of the conveyance device until the panel gets into contact with the contact sections of the pins 5 — the suction cups releasing the panel and the panel applying a downward depressing force to the contact sections of the pins to cause the contact sections of the pins to move downward and compress the cushioning devices, whereby the cushioning devices undergo elastic deformation to cushion the downward depressing force, making the panel stably positioned on the contact sections of the pins of the conveyance device

Fig. 6

PANEL UNPACKING METHOD AND PANEL UNPACKING DEVICE

BACKGROUND OF THE INVENTION

1. Field of the Invention

The present invention relates to the field of manufacturing of liquid crystal display panel, and in particular to a panel unpacking method and a panel unpacking device.

2. The Related Arts

Liquid crystal display (LCD) has a variety of advantages, such as thin device body, low power consumption, and being free of radiation, and is thus widely used.

Referring to FIG. 1, a liquid crystal display device generally comprises a backlight module 100, a mold frame 300 arranged on the backlight module, a liquid crystal display panel 500 arranged on the mold frame 300, and a front bezel 700 arranged on the liquid crystal display panel 500. The backlight module 100 provides a planar light source of homogeneous illumination to the liquid crystal display panel 500. The mold frame 300 carries the liquid crystal display panel 500. The front bezel 700 retains the liquid crystal display panel 500 on the mold frame 300.

In the manufacture of liquid crystal panel, the first step is to depackage panels (glass substrates). The unpacking process of the panels is using a robot to remove the panels out of a packaging bag one by one and to place the panels on a conveyance device to allow the conveyance device to convey the panels to the subsequent process.

Referring to FIGS. 2-5, in a conventional process of unpacking panels, the operation is as follows. A six-axis robot 900 having end effectors formed of vacuum suction cups 902 to suck and hold a panel 550, followed by lifting. Then, a movement is made by a distance in a direction toward a conveyance device (not shown) and then stopped. The panel 550 is rotated to make upper and lower sides of the panel 550 reversed, whereby the vacuum cups 902 that were originally holding the panel 550 from the upper side are now supporting the panel 550 from the lower side. Next, movement is continued in the direction toward the conveyance device until reaching a location above pins 750 of the conveyance device on which the panel 550 is positionable. Next, the vacuum cups 902 supports the panels 550 and moves downward to stably position the panel 550 on the pins 750 of the conveyance device for supporting the panel 550. The process takes about 30 seconds.

In the above described panel unpacking process, since it includes an operation of rotation, there is a high risk that the panel gets broken in this operation. Since the rotation operation needs a large amount of space, the facility would have a large volume and the panel must be moved for a large distance. In addition, position restoration through rotation is necessary so that the entire panel unpacking process is very complicated and the efficiency of the facility is low.

The reason for rotating the panel is to set the vacuum cups at a location under the panel in order to properly support the panel thereon so that the subsequent lowering movement relative to the pins is carried out to allow the panel to directly contact the pins of the conveyance device that are provided to support the panel and thus stably position the panel on the pins.

SUMMARY OF THE INVENTION

An object of the present invention is to provide a panel unpacking method, which effectively increases panel unpacking efficiency and effectively lowers down the chance of breaking panel so as to reduce the manufacturing cost.

Another object of the present invention is to provide a panel unpacking device, which comprises cushioning springs provided on pins that are provided on a conveyance device for supporting the panel to effectively reduce the chance of breaking panel and which does not need a robot to rotate so as to effectively increase the panel unpacking efficiency.

To achieve the objects, the present invention provides a panel unpacking method, comprising the following steps:

(1) providing a panel unpacking device, wherein the panel unpacking device comprises a pickup device and a conveyance device, the pickup device comprising a manipulator and suction cups mounted to ends of the manipulator, the conveyance device comprising a main body, a mounting board mounted on the main body, pins mounted on the mounting board, and cushioning devices installed on the pins, the pins each comprising a pin stem and a contact section connected to an end of the pin stem, the cushioning devices each having an end positioned against the contact section of the respective pin and an opposite end positioned against the mounting board, the mounting board forming a plurality of positioning holes corresponding to the pins, ends of the pin stems of the pins that are distant from the contact sections being respectively received in the positioning holes and movable in the positioning holes in an axial direction of the positioning holes;

(2) moving the manipulator to a location exactly above a panel to be unpacked and moving the manipulator downward to approach the panel until the suction cups at the ends of the manipulator get into contact with the panel;

(3) the suction cups sucking and holding the panel and the manipulator making a movement to lift up the panel;

(4) the manipulator carrying and moving the panel to a location exactly above the conveyance device, the manipulator moving downward to approach the pins of the conveyance device until the panel gets into contact with the contact sections of the pins; and (5) the suction cups releasing the panel and the panel applying a downward depressing force to the contact sections of the pins to cause the contact sections of the pins to move downward and compress the cushioning devices, whereby the cushioning devices undergo elastic deformation to cushion the downward depressing force, making the panel stably positioned on the contact sections of the pins of the conveyance device.

The pickup device comprises a control system and an air passage system. The control system controls operation of the manipulator. The air passage system controls suction and release of the suction cups.

The conveyance device comprises a traveling system. The traveling system controls movement of the conveyance device to convey the panel carried on the pins to the next operation site.

The contact sections of the pins are of a spherical form.

The cushioning devices comprise cushioning springs fit over the pin stems.

The present invention also provides a panel unpacking method, which comprises the following steps:

(1) providing a panel unpacking device, wherein the panel unpacking device comprises a pickup device and a conveyance device, the pickup device comprising a manipulator and suction cups mounted to ends of the manipulator, the conveyance device comprising a main body, a mounting board mounted on the main body, pins mounted on the mounting board, and cushioning devices installed on the pins, the pins each comprising a pin stem and a contact section connected to an end of the pin stem, the cushioning devices each having an end positioned against the contact section of the respective pin and an opposite end positioned against the mounting board, the mounting board forming a plurality of positioning holes corresponding to the pins, ends of the pin stems of the pins that are distant from the contact sections being respectively received in the positioning holes and movable in the positioning holes in an axial direction of the positioning holes;

(2) moving the manipulator to a location exactly above a panel to be unpacked and moving the manipulator downward to approach the panel until the suction cups at the ends of the manipulator get into contact with the panel;

(3) the suction cups sucking and holding the panel and the manipulator making a movement to lift up the panel;

(4) the manipulator carrying and moving the panel to a location exactly above the conveyance device, the manipulator moving downward to approach the pins of the conveyance device until the panel gets into contact with the contact sections of the pins; and (5) the suction cups releasing the panel and the panel applying a downward depressing force to the contact sections of the pins to cause the contact sections of the pins to move downward and compress the cushioning devices, whereby the cushioning devices undergo elastic deformation to cushion the downward depressing force, making the panel stably positioned on the contact sections of the pins of the conveyance device;

wherein the pickup device comprises a control system and an air passage system, the control system controlling operation of the manipulator, the air passage system controlling suction and release of the suction cups;

wherein the conveyance device comprises a traveling system, the traveling system controlling movement of the conveyance device to convey the panel carried on the pins to the next operation site;

wherein the contact sections of the pins are of a spherical form; and wherein the cushioning devices comprise cushioning springs fit over the pin stems.

The present invention further provides a panel unpacking device, which comprises a pickup device and a conveyance device. The pickup device comprises a manipulator and suction cups mounted to ends of the manipulator. The conveyance device comprises a main body, a mounting board mounted on the main body, pins mounted on the mounting board, and cushioning devices installed on the pins. The pins each comprise a pin stem and a contact section connected to an end of the pin stem. The cushioning devices each has an end positioned against the contact section of the respective pin and an opposite end positioned against the mounting board. The mounting board forms a plurality of positioning holes corresponding to the pins. Ends of the pin stems of the pins that are distant from the contact sections are respectively received in the positioning holes and movable in the positioning holes in an axial direction of the positioning holes.

The pickup device comprises a control system and an air passage system. The control system controls operation of the manipulator. The air passage system controls suction and release of the suction cups.

The conveyance device comprises a traveling system. The traveling system controls movement of the conveyance device to convey the panel carried on the pins to the next operation site.

The contact sections of the pins are of a spherical form.

The cushioning devices comprise cushioning springs fit over the pin stems.

The efficacy of the present invention is that the present invention provides a panel unpacking method and a panel unpacking device, which comprises cushioning devices mounted on pins of a conveyance device for carrying the panel to effectively cushion the panel and prevent breaking occurring at the contact between the panel and the pins so as to effectively lower down the manufacture cost. Further, due to the arrangement of the cushioning springs, it is possible for a manipulator to position the panel from the top side directly onto the pins without having the panel rotated to be supported from the bottom side by suction cups before being positioned on the pins as is necessary in the prior art, whereby the time necessary for unpacking the panel is reduced and the distance between the manipulator and the conveyance device can be shorten for no rotation is necessary so as to reduce the amount of space occupied and further reduce the manufacture cost.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings:

FIG. 6 is a flow chart illustrating a panel unpacking method according to the present invention.

DETAILED DESCRIPTION OF THE PREFERRED EMBODIMENTS

Figure 1:
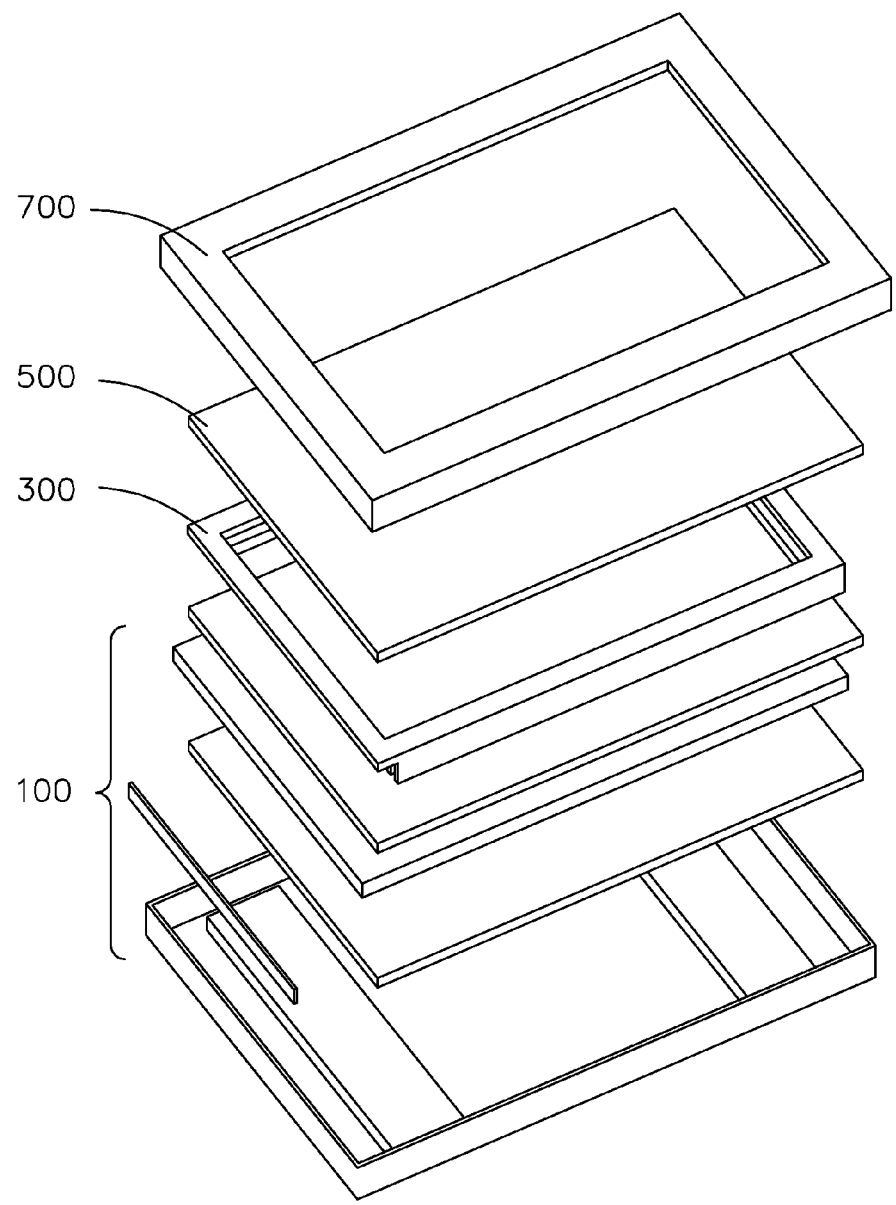
FIG. 1 is an exploded view showing a conventional liquid crystal display device.
Figure 2:
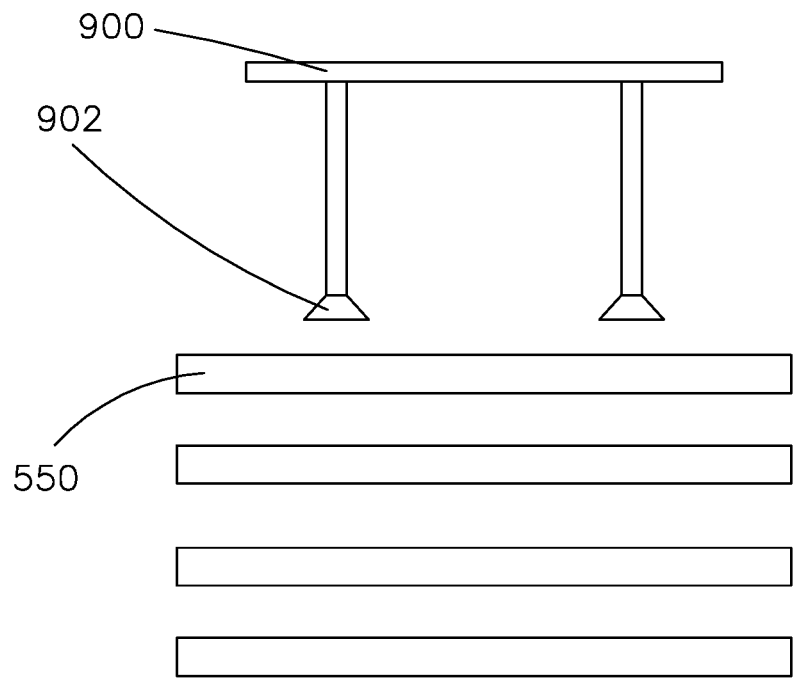
FIGS. 2-5 are schematic views illustrating a conventional panel unpacking process.
Figure 3:
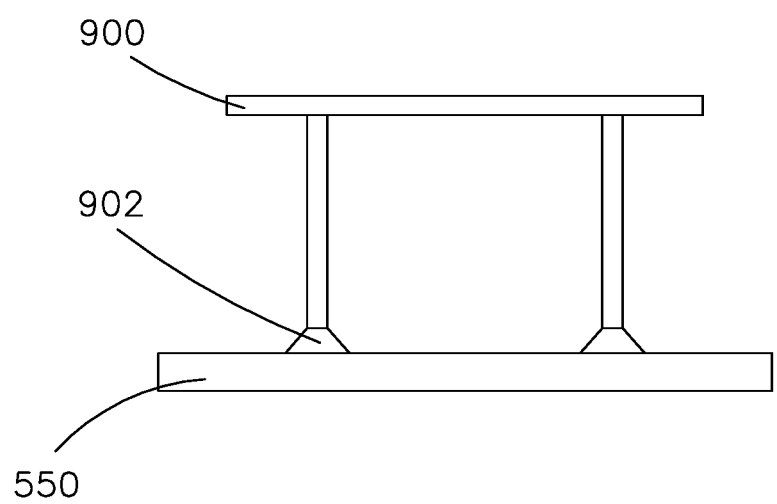
Figure 4:
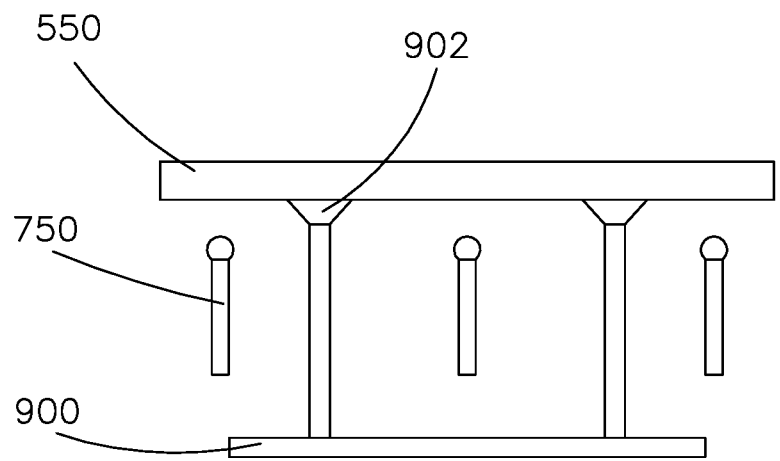
Figure 5:
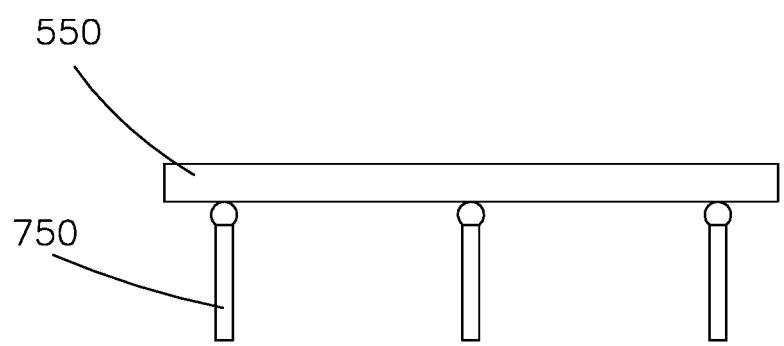

To further expound the technical solution adopted in the present invention and the advantages thereof, a detailed description is given to a preferred embodiment of the present invention and the attached drawings.

Referring to FIGS. 6-9, the present invention provides a panel unpacking method, which comprises the following steps:

Step 1: providing a panel unpacking device, wherein the panel unpacking device comprises a pickup device 22 and a conveyance device 24, the pickup device 22 comprising a manipulator 222 and suction cups 224 mounted to ends of the manipulator 222, the conveyance device 24 comprising a main body 240, a mounting board 241 mounted on the main body 240, pins 242 mounted on the mounting board 241, and cushioning devices 244 installed on the pins 242, the pins 242 each comprising a pin stem 246 and a contact section 248 connected to an end of the pin stem 246, the cushioning devices 244 each having an end positioned against the contact section 248 of the respective pin 242 and an opposite end positioned against the mounting board 241, the mounting board 241 forming a plurality of positioning holes 243 corresponding to the pins 242, ends of the pin stems 246 of the pins 242 that are distant from the contact sections 248 being respectively received in the positioning holes 243 and movable in the positioning holes 243 in an axial direction of the positioning holes 243.

In the instant embodiment, the contact sections 248 are of a spherical form. The cushioning devices 244 are cushioning springs that are fit over the pin stems 246. When a panel 40 gets into contact with the contact sections 248, the contact sections 248 compress the cushioning devices 244 to effect cushioning of the panels 40 so as to prevent the panel 40 from being broken by rigid contact between the contact sections 248 and the panel 40.

Figure 7:
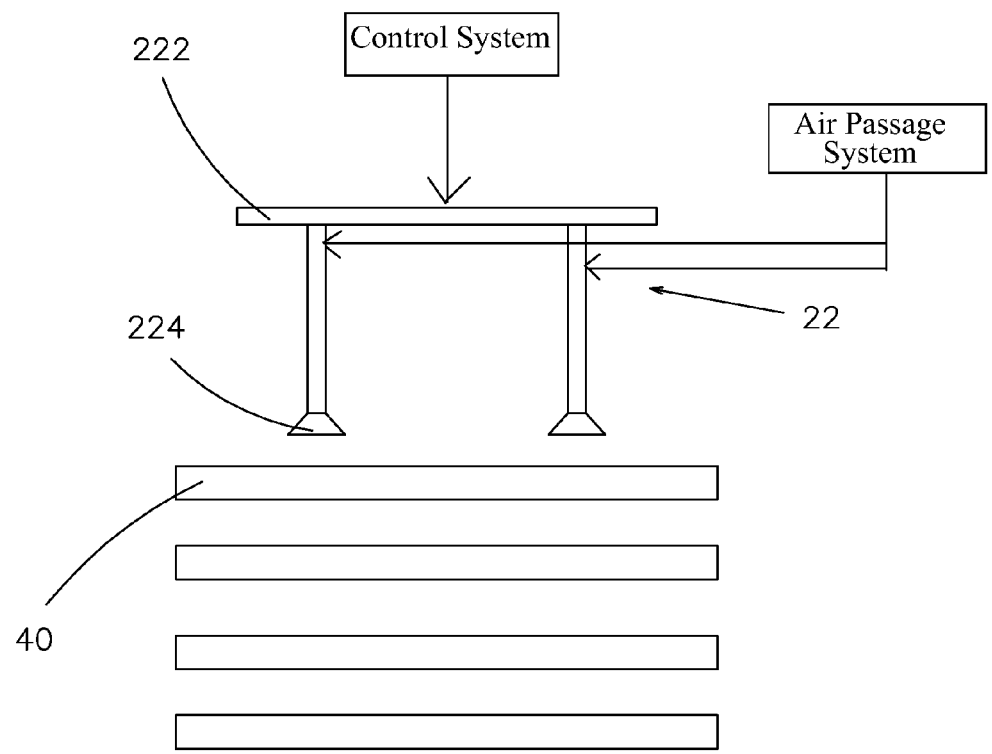
FIGS. 7-9 are schematic views illustrating a process of unpacking panel by using the panel unpacking method according to the present invention.

It is noted that the pickup device 22 further comprises a control system (FIG. 7) and an air passage system (FIG. 7). The control system controls the operation of the manipulator 222. The air passage system controls suction and release of the suction cups 224. The conveyance device 24 further comprises a traveling system. The traveling system controls the movement of the conveyance device 24 to convey the panel 40 carried on the pins 242 to the next operation site.

Step 2: moving the manipulator 222 to a location exactly above a panel 40 to be unpacked and moving the manipulator 222 downward to approach the panel 40 until the suction cups 224 at the ends of the manipulator 222 get into contact with the panel 40.

The control system controls the manipulator 222 to move to the location exactly above the panel 40 to be unpacked and then controls the manipulator 222 to move downward to approach the panel 40 until the suction cups 224 at the ends of the manipulator 222 gets into contact with the panel 40.

Step 3: the suction cups 224 sucking and holding the panel 40 and the manipulator 222 making a movement to lift up the panel 40.

The air passage system controls the suction cups 224 to suck and hold the panel 40 and the control system controls the manipulator 222 to make a movement to lift up the panel 40.

Step 4: the manipulator 222 carrying and moving the panel 40 to a location exactly above the conveyance device 24, the manipulator 222 moving downward to approach the pins 242 of the conveyance device 24 until the panel 40 gets into contact with the contact sections 248 of the pins 242.

The control system controls the manipulator 222 to carry the panel 40 to the located exactly above the conveyance device 24 and then controls the manipulator 222 to move downward to approach the pins 242 of the conveyance device 24 until the panel 40 gets into contact with the contact sections 248 of the pins 242.

Step 5: the suction cups 224 releasing the panel 40 and the panel 40 applying a downward depressing force to the contact sections 248 of the pins 242 to cause the contact sections 248 of the pins 242 to move downward and compress the cushioning devices 244, whereby the cushioning devices 244 undergo elastic deformation to cushion the downward depressing force, making the panel 40 stably positioned on the contact sections 248 of the pins 242 of the conveyance device 24.

The air passage system controls the suction cups 224 to release the panel 40 and the panel 40 applies a downward depressing force to the contact sections 248 of the pins 242. The cushioning devices 244 cushion the depressing force to prevent the panel 40 from being broken by rigid contact between the panel 40 and the contact sections 248 of the pins 242.

Figure 8:
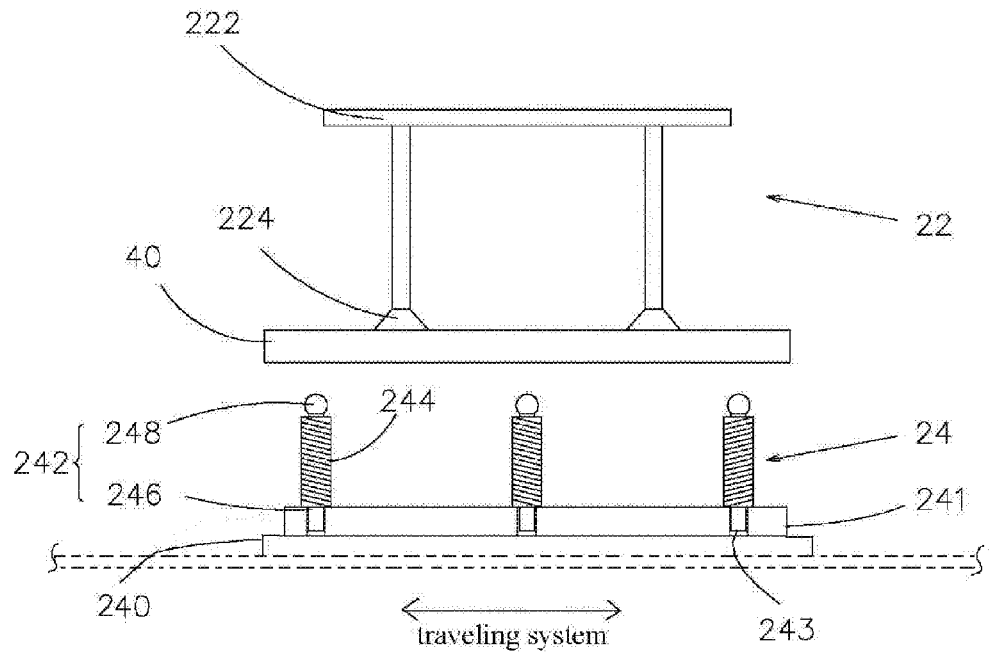
Figure 9:
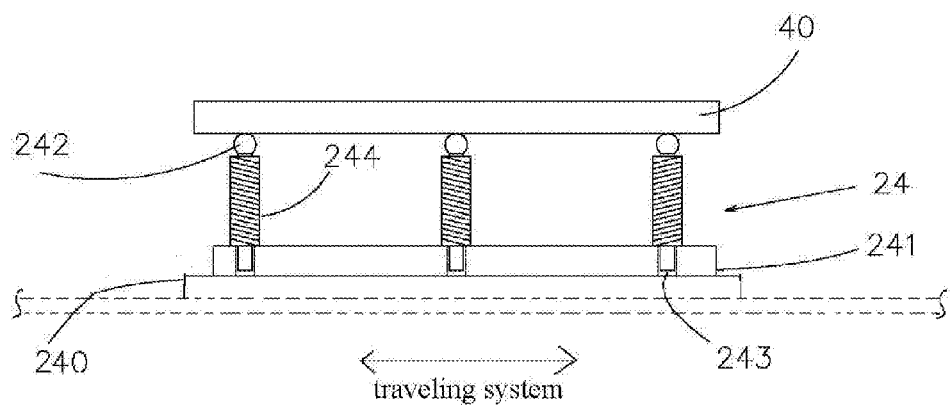

Referring to FIGS. 7-9, the present invention also provides a panel unpacking device, which comprises a pickup device 22 and a conveyance device 24. The pickup device 22 comprises a manipulator 222 and suction cups 224 mounted to ends of the manipulator 222. The conveyance device 24 comprises a main body 240, a mounting board 241 mounted on the main body 240, pins 242 mounted on the mounting board 241, and cushioning devices 244 installed on the pins 242. The pins 242 each comprise a pin stem 246 and a contact section 248 connected to an end of the pin stem 246. The cushioning devices 244 each have an end positioned against the contact section 248 of the respective pin 242 and an opposite end positioned against the mounting board 241. The mounting board 241 forms a plurality of positioning holes 243 corresponding to the pins 242. Ends of the pin stems 246 of the pins 242 that are distant from the contact sections 248 are respectively received in the positioning holes 243 and movable in the positioning holes 243 in an axial direction of the positioning holes 2433.

In the instant embodiment, the contact sections 248 are of a spherical form. The cushioning devices 244 are cushioning springs that are fit over the pin stems 246. When a panel 40 gets into contact with the contact sections 248, the contact sections 248 compress the cushioning devices 244 to effect cushioning of the panels 40 so as to prevent the panel 40 from being broken by rigid contact between the contact sections 248 and the panel 40.

It is noted that the pickup device 22 further comprises a control system (FIG. 7) and an air passage system (FIG. 7). The control system controls the operation of the manipulator 222. The air passage system controls suction and release of the suction cups 224. The conveyance device 24 further comprises a traveling system. The traveling system controls the movement of the conveyance device 24 to convey the panel 40 carried on the pins 242 to the next operation site.

In summary, the present invention provides a panel unpacking method and a panel unpacking device, which comprises cushioning devices mounted on pins of a conveyance device for carrying the panel to effectively cushion the panel and prevent breaking occurring at the contact between the panel and the pins so as to effectively lower down the manufacture cost. Further, due to the arrangement of the cushioning springs, it is possible for a manipulator to position the panel from the top side directly onto the pins without having the panel rotated to be supported from the bottom side by suction cups before being positioned on the pins as is necessary in the prior art, whereby the time necessary for unpacking the panel is reduced and the distance between the manipulator and the conveyance device can be shorten for no rotation is necessary so as to reduce the amount of space occupied and further reduce the manufacture cost.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A panel unpacking method, comprising the following steps:
   (1) providing a panel unpacking device, wherein the panel unpacking device comprises a pickup device and a conveyance device, the pickup device comprising a manipulator and suction cups mounted to ends of the manipulator, the conveyance device comprising a main body, a mounting board mounted on the main body, pins mounted on the mounting board, and cushioning devices installed on the pins, the pins each comprising a pin stem and a contact section connected to an end of the pin stem, the cushioning devices each having an end positioned against the contact section of the respective pin and an opposite end positioned against the mounting board, the mounting board forming a plurality of positioning holes corresponding to the pins, ends of the pin stems of the pins that are distant from the contact sections being respectively received in the positioning holes and movable in the positioning holes in an axial direction of the positioning holes;

(2) moving the manipulator to a location exactly above a panel to be unpacked and moving the manipulator downward to approach the panel until the suction cups at the ends of the manipulator get into contact with the panel;

(3) the suction cups sucking and holding the panel and the manipulator making a movement to lift up the panel;

(4) the manipulator carrying and moving the panel to a location exactly above the conveyance device, the manipulator moving downward to approach the pins of the conveyance device until the panel gets into contact with the contact sections of the pins, wherein the suction cups and the pins are on opposite sides of the panel and are vertically opposite to each other; and (5) the suction cups releasing the panel from a top side of the panel to allow the panel to apply a downward depressing force to the contact sections of the pins that is on the bottom side of the panel so as to cause the contact sections of the pins to move downward and compress the cushioning devices, whereby the cushioning devices undergo elastic deformation to cushion the downward depressing force, making the panel stably positioned on the contact sections of the pins of the conveyance device.

2. The panel unpacking method as claimed in claim 1, wherein the pickup device comprises a control system and an air passage system, the control system controlling operation of the manipulator, the air passage system controlling suction and release of the suction cups.

3. The panel unpacking method as claimed in claim 1, wherein the contact sections of the pins are of a spherical form.

4. The panel unpacking method as claimed in claim 1, wherein the cushioning devices comprise cushioning springs fit over the pin stems.

5. A panel unpacking method, comprising the following steps:

(1) providing a panel unpacking device, wherein the panel unpacking device comprises a pickup device and a conveyance device, the pickup device comprising a manipulator and suction cups mounted to ends of the manipulator, the conveyance device comprising a main body, a mounting board mounted on the main body, pins mounted on the mounting board, and cushioning devices installed on the pins, the pins each comprising a pin stem and a contact section connected to an end of the pin stem, the cushioning devices each having an end positioned against the contact section of the respective pin and an opposite end positioned against the mounting board, the mounting board forming a plurality of positioning holes corresponding to the pins, ends of the pin stems of the pins that are distant from the contact sections being respectively received in the positioning holes and movable in the positioning holes in an axial direction of the positioning holes;

(2) moving the manipulator to a location exactly above a panel to be unpacked and moving the manipulator downward to approach the panel until the suction cups at the ends of the manipulator get into contact with the panel;

(3) the suction cups sucking and holding the panel and the manipulator making a movement to lift up the panel;

(4) the manipulator carrying and moving the panel to a location exactly above the conveyance device, the manipulator moving downward to approach the pins of the conveyance device until the panel gets into contact with the contact sections of the pins, wherein the suction cups and the pins are on opposite sides of the panel and are vertically opposite to each other; and (5) the suction cups releasing the panel from a top side of the panel to allow the panel to apply a downward depressing force to the contact sections of the pins that is on the bottom side of the panel so as to cause the contact sections of the pins to move downward and compress the cushioning devices, whereby the cushioning devices undergo elastic deformation to cushion the downward depressing force, making the panel stably positioned on the contact sections of the pins of the conveyance device;

wherein the pickup device comprises a control system and an air passage system, the control system controlling operation of the manipulator, the air passage system controlling suction and release of the suction cups;

wherein the contact sections of the pins are of a spherical form; and wherein the cushioning devices comprise cushioning springs fit over the pin stems.

6. A panel unpacking device, comprising a pickup device and a conveyance device, the pickup device comprising a manipulator and suction cups mounted to ends of the manipulator, the conveyance device comprising a main body, a mounting board mounted on the main body, pins mounted on the mounting board, and cushioning devices installed on the pins, the pins each comprising a pin stem and a contact section connected to an end of the pin stem, the cushioning devices each having an end positioned against the contact section of the respective pin and an opposite end positioned against the mounting board, the mounting board forming a plurality of positioning holes corresponding to the pins, ends of the pin stems of the pins that are distant from the contact sections being respectively received in the positioning holes and movable in the positioning holes in an axial direction of the positioning holes, wherein the suction cups of the manipulator and the contact sections of the pins are vertically opposite to each other so that the suction cups are adapted to suction-hold a top side of a panel and the suction cups are operable to releases the panel from the top side of the panel to allow the panel to apply a downward depressing force to the contact sections of the pins that is on an opposite, bottom side of the panel so as to cause the contact sections of the pins to move downward and compress the cushioning devices, whereby the cushioning devices undergo elastic deformation to cushion the downward depressing force, making the panel stably positioned on the contact sections of the pins of the conveyance device.

7. The panel unpacking device as claimed in claim 6, wherein the pickup device comprises a control system and an air passage system, the control system controlling operation of the manipulator, the air passage system controlling suction and release of the suction cups.

8. The panel unpacking device as claimed in claim 6, wherein the contact sections of the pins are of a spherical for.

9. The panel unpacking device as claimed in claim 6, wherein the cushioning devices comprise cushioning springs fit over the pin stems.

* * * * *